United States Patent [19]

Kageshima

[11] Patent Number: 5,784,591
[45] Date of Patent: Jul. 21, 1998

[54] PARALLEL SIMULATOR FOR SEMICONDUCTOR INTEGRATED CIRCUIT

[75] Inventor: Atsushi Kageshima, Kanagawa-ken, Japan

[73] Assignee: Kabushiki Kaisha Toshiba, Kawasaki, Japan

[21] Appl. No.: 501,508

[22] Filed: Jul. 11, 1995

[30] Foreign Application Priority Data

Jul. 12, 1994 [JP] Japan ................................... 6-160347

[51] Int. Cl.$^6$ ................................................ G06F 15/16
[52] U.S. Cl. ................. 395/500; 395/200.03; 395/200.2; 395/920; 364/578
[58] Field of Search ........................... 364/578; 395/500

[56] References Cited

U.S. PATENT DOCUMENTS

| | | | |
|---|---|---|---|
| 5,375,074 | 12/1994 | Greenberg et al. | 364/578 |
| 5,442,772 | 8/1995 | Childs et al. | 395/500 |
| 5,550,760 | 8/1996 | Razdan et al. | 364/578 |
| 5,615,127 | 3/1997 | Beatty et al. | 364/489 |

OTHER PUBLICATIONS

Nishigaki et al., "Hierarchical Decomposition System and its Availability for Network Solution," Circuits and Systems, 1991 IEEE International Symposium, pp. 884–887, 1991.

Hassoun et al., "An Efficient Partitioning Algorithm for Large–Scale Circuits," Circuits and Systems, 1990 IEEE International Symposium, 1990, pp. 2405–2408.

Onozuka et al., "Development of Parallelism for Circuit Simulation by Tearing," European Design Automation Conference, Feb. 1993, pp. 12–17.

Reed et al. "Parallel Discrete Event Simulation Using Shared Memory," IEEE Transactions on Software Engineering, vol. 14, No. 4, Apr. 1988, pp. 541–553.

Mueller–Thuns et al. "Portable Logic and Fault Simulation," Computer Aided Design, 1989 International Conference, pp. 506–509.

Righter et al. "Distributed Simulation of Discrete Event Systems," Proceedings of the IEEE, vol. 77, No. 1, Jan. 1989, pp. 99–113.

Hsieh et al. "Parallel Event–Driven MOS Timing Simulator on Distributed Memory Multiprocessors," IEE Proceedings–Circuits, Devices, and Systems, formerly part G. vol. 143, No. 4, Aug. 1996, pp. 207–212.

Baker et al. "Parallel Event–Driven Logic Simulation Algorithms: Tutorial and Comparative Evaluation," IEE Proceedings–Circuits, Devices, and Systems, formerly Part G. vol. 143, No. 4, Aug. 1996, pp. 177–185.

Primary Examiner—Kevin J. Teska
Assistant Examiner—Russell W. Frejd
Attorney, Agent, or Firm—Foley & Lardner

[57] ABSTRACT

A parallel simulator for a semiconductor integrated circuit comprises clients C1, C2 in a network of work stations, for executing simulation of corresponding partial circuits of a simulated circuit at time units in parallel to other clients and updating internal node values, and a server formed of a work station, for synchronizing respective simulations of the partial circuits which are effected in parallel by managing interface (I/F) node values, transmitting/receiving the I/F node values to/from the client C1, C2 for every time unit of simulation, and updating the I/F node values. Thereby, simulation time can be shortened and memory for storing information necessary for simulation can be decreased.

10 Claims, 8 Drawing Sheets

| NS1B | NC1 | NC2 | NS1A |
|------|-----|-----|------|
| 0 | 0 | 0 | 0 |
| 0 | 0 | 1 | 1 |
| 0 | 0 | X | X |
| 0 | 1 | 1 | 1 |
| 0 | X | X | X |
| 1 | 0 | 0 | 0 |
| 1 | 0 | 1 | 0 |
| 1 | 1 | 1 | 1 |
| 1 | 1 | X | X |
| 1 | X | X | 1 |
| X | 0 | 0 | 0 |
| X | 0 | X | 0 |
| X | 1 | X | 1 |
| X | 1 | 1 | 1 |
| X | X | X | X |

FIG.7 UPDATE PROCESS OF I/F NODE VALUES

| | CHANGED I/F NODE VALUES AFTER ONE UNIT TIME SIMULATION | | | | | | UNCHANGED I/F NODE VALUES AFTER ONE UNIT TIME SIMULATION | | | | | |
|---|---|---|---|---|---|---|---|---|---|---|---|---|
| | PRIOR ART | | | PRESENT INVENTION | | | PRIOR ART | | | PRESENT INVENTION | | |
| | SERVER | CLIENT 1 | CLIENT 2 | SERVER | CLIENT 1 | CLIENT 2 | SERVER | CLIENT 1 | CLIENT 2 | SERVER | CLIENT 1 | CLIENT 2 |
| SERVER READS I/F NODE INITIAL VALUES (104) | 0 | null | null | 0 | null | null | 0 | null | null | 0 | null | null |
| SERVER TRANSMITS I/F NODE VALUES TO CLIENTS (105) | 0 | 0→0 | 0→0 | 0 | null | null | 0 | 0→0 | 0→0 | 0 | null | null |
| CLIENTS RECEIVE I/F NODE VALUES (106) | 0 | 0→1 | 0→0 | null | 0→1 | 0→0 | 0 | 0→0 | 0→0 | null | 0→0 | 0→0 |
| CLIENTS EXECUTE SIMULATION (108) | 010 | X | 0 | N | 1 | 0 | 000 | 0 | 0 | NN | 0 | 0 |
| CLIENTS TRANSMIT NEW I/F NODE VALUES TO SERVER (109,111) | (010) | 1 | 0 | (N) | 1 | 0 | (000) | 0 | 0 | (NN) | 0 | 0 |
| SERVER COMPARES I/F NODE VALUES (113) | 1 | 1 | 0 | 1 | 1 | 0 | 0 | 0 | 0 | N | 0 | 0 |
| SERVER UPDATES I/F NODE VALUES (113) | 1 | 11 | 10 | null | 11 | 10 | 0 | 00 | 00 | null | NO | NO |
| SERVER TRANSMITS UPDATED I/F NODE VALUES TO CLIENTS (105) | 1 | 1 | 1 | null | 1 | 1 | 0 | 0 | 0 | null | 0 | 0 |
| CLIENTS RECEIVE UPDATED I/F NODE VALUES (106) | | | | | | | | | | | | |

FIG. 8

| NSIB | NC1 | NC2 | NS1A |
|------|-----|-----|------|
| N | N | N | N |
| N | N | 0 | 0 |
| N | N | 1 | 1 |
| N | N | X | X |
| N | 0 | 0 | 0 |
| N | 1 | 1 | 1 |
| N | X | X | X |
| N | 0 | N | 0 |
| 0 | 1 | N | 1 |
| 0 | X | N | X |
| 0 | N | 1 | N |
| 0 | N | X | 1 |
| 0 | 1 | N | X |
| 0 | 1 | 1 | 1 |
| 1 | X | N | 1 |
| 1 | X | X | X |
| 1 | N | N | N |
| 1 | N | 0 | 0 |
| 1 | 0 | X | X |
| 1 | 0 | N | 0 |
| X | X | 0 | 0 |
| X | X | X | X |
| X | N | N | N |
| X | N | 0 | 0 |
| X | 0 | 0 | 1 |
| X | 0 | 1 | 0 |
| X | 1 | N | 0 |
| X | 1 | 0 | 1 |
|   |   | N | 1 |
|   |   | 1 |   |

| NC1 | NC2 | NS1A |
|---|---|---|
| N N N N 0 1 X 0 1 X | N 0 1 X 0 1 X N N N | N 0 1 X 0 1 X 0 1 X |

PARALLEL SIMULATOR FOR SEMICONDUCTOR INTEGRATED CIRCUIT

BACKGROUND OF THE INVENTION

1. Field of the Invention

The present invention relates to a parallel simulator for effecting a circuit simulation of a semiconductor integrated circuit and, more particularly, to a parallel simulator for effecting a circuit simulation in parallel by operating a plurality of work stations in parallel.

2. Description of the Prior Art

As a parallel simulator for simulating a circuit operation of a semiconductor integrated circuit, a special purpose parallel simulator composed of a plurality of hardwares devices which have been developed for special purpose parallel simulation are well known in the art. Since parallel simulators employed in special purpose devices lack general purpose application, these special purpose parallel simulators are unsuitable for various circuit simulations.

In contrast, there is also known a general purpose parallel simulator composed of a network of general purpose work stations. That is, one of the general purpose work stations serves as a server for managing all node values of a simulated circuit (i.e., a circuit to be simulated), and the remaining general purpose work stations, each assigned correspondingly to one of a plurality of partial circuits defined by dividing the simulated circuit, serve as clients for executing actual simulations of the partial circuits by using node values of respective partial circuits received from the server. Thus the general purpose parallel simulator effects circuit simulations in parallel by operating respective work stations in parallel.

In such parallel simulators, in order to synchronize respective simulations executed in respective clients, all node values of the simulated circuit must be transmitted to the server and managed collectively therein. In addition, respective clients must independently maintain the node values required for their own circuit simulations.

For instance, in a simulated circuit divided into a partial circuit B1 and a partial circuit B2 as shown in FIG. 1, node values of the simulated circuit, i.e., node values of interface (I/F) nodes I/1 to I7 and node values of internal nodes N1 to N3 are managed as shown in FIG. 2. The interface (I/F) nodes I1 to I7 serve as terminals to be connected to external input/output terminals of the partial circuit B1, the partial circuit B2 and other partial circuits. The internal nodes N1 to N3 are completed within respective partial circuits B1 and B2. As shown in FIG. 2, nodes values of the I/F node I4 and I6 must be maintained by both the server S/1 and the clients C1 and C2 which effect respective circuit simulations of the partial circuits B/1 and B2.

In such a managing scheme, in order to synchronize respective clients during the simulation, all node values must be transmitted to the server at every time unit of the simulation to be updated therein, and then updated node values must be transmitted to respective clients.

Consequently, the internal node values assigned to respective clients are also transmitted to the server and updated therein. In addition, as shown in FIG. 3, even if node values are not changed, node values are transmitted from respective clients to the server and are included in the update process. Further, when node values managed by a plurality of clients are updated in the server, simulation values are first compared with values obtained at the preceding time unit, and, if simulation values transmitted from respective clients differ from each other, the simulation values different from the values at the preceding time unit are then updated to reflect the new simulation values.

That is, in node management as shown in FIG. 2, in which the same node values are managed concurrently by a plurality of clients, some node values are determined after simulation, like combination patterns shown in FIG. 4. In FIG. 4, a reference NS1B denotes a node value at the preceding time unit in the server S1; NC1, a node value obtained by simulation at the most recent time unit in the client C1; NC2, a node value obtained by the simulation at the most recent time unit in the client C2; NS1A, a node value updated after simulation in the server S1; "0", a node value of 0; "1", a node value of 1; and "x", don't care. Therefore, when node values which are managed concurrently by a plurality of clients are updated, the node values from the preceding time unit must be maintained in case simulation values transmitted from respective clients differ from each other. This is because the simulation values must be compared with the node values from the preceding time unit, and values different from the node values from the preceding time unit must be updated to match the simulation values at the succeeding time unit.

As has been explained above, in the conventional parallel simulator composed of general purpose work stations, all node values of the simulated circuit are managed by the server. Therefore, a large amount of information must be transmitted between the server and the clients, and thus much time is required to transmit information. In addition, a memory area used for storing all node values must be provided in the server, resulting in an increased need for memory capacity.

Further, when node values obtained by simulation at the next time unit are updated, all node values must be transmitted from respective clients to the server to conduct update procedures even if the node values are not changed at all. Therefore, unnecessary update procedures such that unchanged node values are also updated are effected. This causes the drawbacks that more process time is required to update the node values and that more time is needed to complete the entire simulation.

Furthermore, since the node values obtained at the preceding time unit are required to update the node values, extensive memory capacity is required to hold the node values.

SUMMARY OF THE INVENTION

The present invention has been made in view of the above circumstances, and an object of the present invention is to provide a parallel simulator for a semiconductor integrated circuit capable of reducing simulation time and storage capacity required for a circuit simulation by updating node values more effectively and shortening update time.

In order to achieve the above object, a parallel simulator for a semiconductor integrated circuit is provided having a plurality of work stations connected mutually as a network, comprising: simulation sections (clients) formed of the plurality of work stations corresponding to a plurality of partial circuits which are defined by dividing a simulated circuit, for executing simulation of corresponding partial circuits every time unit in parallel, and updating internal node values which are completed in said corresponding partial circuits; and a node managing section (server) formed of one work station, for synchronizing respective simulations of said partial circuits which are effected in parallel by managing interface (I/F) node values such as external input/ output terminals of respective partial circuits and external input/output terminals connected to extend over a plurality of partial circuits, transmitting said I/F node values to said simulation sections for every simulation time unit, and updating said I/F node values.

In addition, in a parallel simulator for a semiconductor integrated circuit of the present invention, said node managing section reads circuit information of said simulated circuit written by a circuit description language, divides the simulated circuit into partial circuits based on the circuit information, extracts the I/F nodes according to the divided partial circuits, examines correspondences between the extracted I/F nodes and the partial circuits, and transmits this information to corresponding simulation sections.

Further, in a parallel simulator for a semiconductor integrated circuit of the present invention, the node managing section updates and manages the I/F node values by transmitting/receiving high level (1), low level (0), don't care (x) and unchanged information (N) to/from the simulation sections.

Furthermore, in a parallel simulator for a semiconductor integrated circuit of the present invention, the simulation sections transmit information indicating unchanged information to said node managing section if all I/F node values pertaining to the simulation section are the same before and after simulation.

Moreover, in a parallel simulator for a semiconductor integrated circuit of the present invention, said simulation sections directly read circuit information defining their corresponding partial circuits from circuit information representing the simulated circuit written in a circuit description language, extract the I/F nodes corresponding to their partial circuits, and transmit extracted I/F node values to said node managing section.

In the above configuration of the present invention, the server updates and manages the I/F node values, whereas the clients update and manage their corresponding internal node values. In addition, in the present invention, if the I/F node values are the same before and after simulation, the I/F node values are updated by transmitting information indicating no change. In addition, in the present invention, the I/F node values are updated by transmitting information indicating no change if all I/F node values concerning one client are the same before and after simulation.

BRIEF DESCRIPTION OF THE DRAWINGS

FIG. 7 is a view showing an update process of the I/F node values in the parallel simulator for a semiconductor integrated circuit according to the procedures in FIG. 6;

FIG. 8 is a view showing update combination patterns of the I/F node values in the parallel simulator for a semiconductor integrated circuit shown in FIG. 5A in a case where a plurality of clients manage the same I/F node values;

DESCRIPTION OF THE PREFERRED EMBODIMENTS

There will now be described preferred embodiments of a parallel simulator for a semiconductor integrated circuit of the present invention with reference to the accompanying drawings.

First Embodiment

Figure 5A:
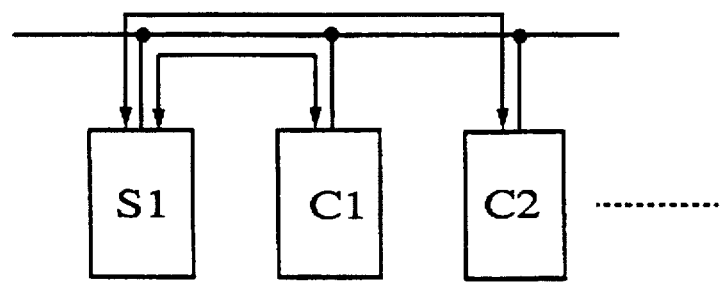
FIG. 5A is a block diagram showing a configuration of a parallel simulator for a semiconductor integrated circuit according to a first embodiment of the present invention.

FIG. 5A is a block diagram showing a configuration of a parallel simulator for a semiconductor integrated circuit according to a first embodiment of the present invention.

Figure 5B:
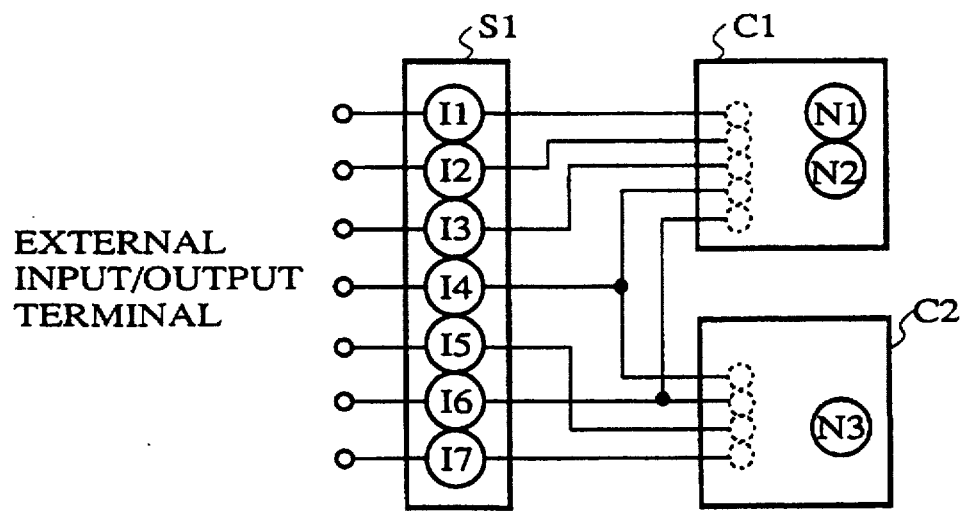
FIG. 5B is a view showing a management state of node values when the circuit shown in FIG. 1 is simulated in the parallel simulator for a semiconductor integrated circuit shown in FIG. 5A.

FIG. 5B is a view showing management of node values in the parallel simulator shown in FIG. 5A. In other words, FIG. 5A shows connection relations between a server S1 and clients C1, C2 and transmission of information therebetween when the parallel simulator according to the first embodiment simulates circuit operation of the simulated circuit shown in FIG. 1. FIG. 5B shows management of values of I/F nodes I1 to I7 and values of internal nodes N1 to N3 in the server S1 and the clients C1, C2 shown in FIG. 5A.

Figure 1:
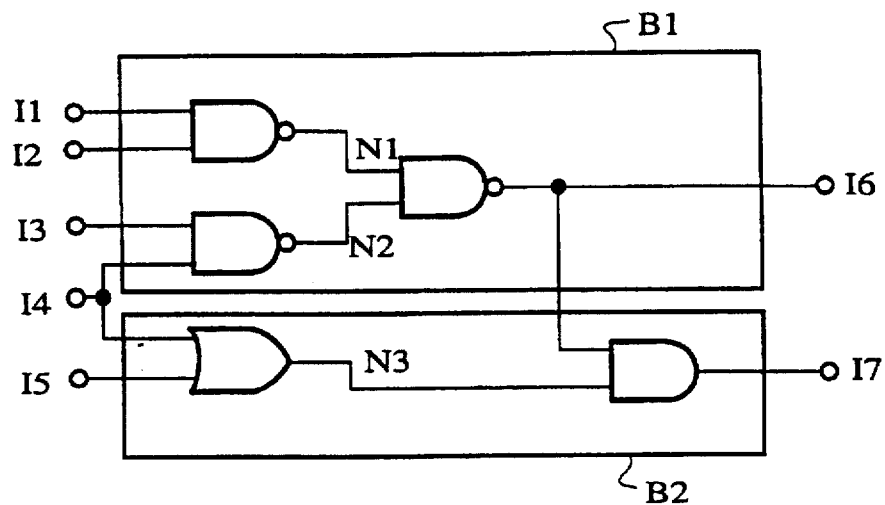
FIG. 1 is a block circuit diagram showing an example of a configuration of a simulated circuit.
Figure 2:
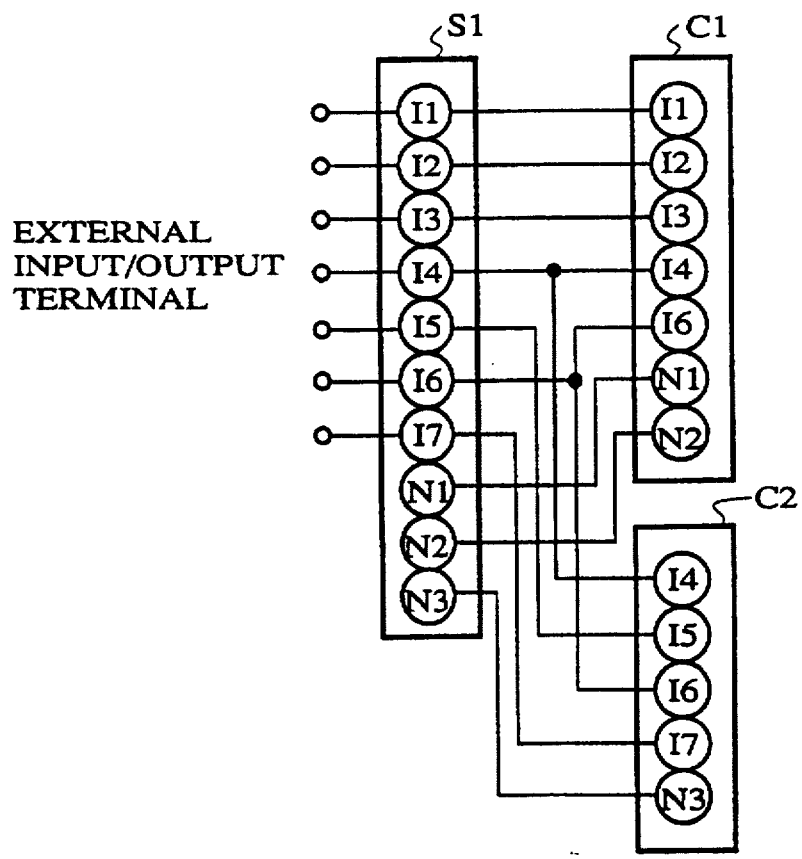
FIG. 2 is a view showing a management state of node values when the circuit shown in FIG. 1 is simulated in a conventional parallel simulator for a semiconductor integrated circuit.

In FIG. 5A, the server S1 serving as the node managing section and clients C1 and C2 simulating respective partial circuits B1 and B2 of the simulated circuit shown in FIG. 1 are composed of general purpose work stations configured to form a network. The clients C1 and C2 are connected in parallel with respect to the server S1.

In FIG. 5B, the server S1 manages the node values of interface (I/F) nodes I1 to I7 of external input/output terminals of the partial circuits B1, B2 and those of external input/output terminals connected so as to extend over a plurality of partial circuits B1, B2. As a result, the server can synchronize simulations of the partial circuits B1, B2 which are effected in parallel by the clients C1, C2, and can transmit and receive the I/F node values to and from respective clients C1, C2 at every simulation time unit to thus update the I/F node values.

The client C1 corresponds to the partial circuit B1 defined by dividing the simulated circuit, and effects circuit simulation of the partial circuit B1 every time unit in parallel with the client C2. In addition, the client C1 updates values of the internal nodes N1, N2 which are located within the corresponding partial circuit B1. The client C2 corresponds to the partial circuit B2 defined by dividing the simulated circuit, and effects circuit simulation of the partial circuit B2 every time unit in parallel with the client C1. In addition, the client C2 updates the value of the internal node N3 which is location within the corresponding partial circuit B1.

FIGS. 5A and 5B, the server S1 and the clients C1, C2 update the I/F node values by transmitting, as I/F node value information, high level (1), low level (0), don't care (x) and unchanged information (N). The unchanged information (N) signal is generated when a node value is not changed.

Figure 6:
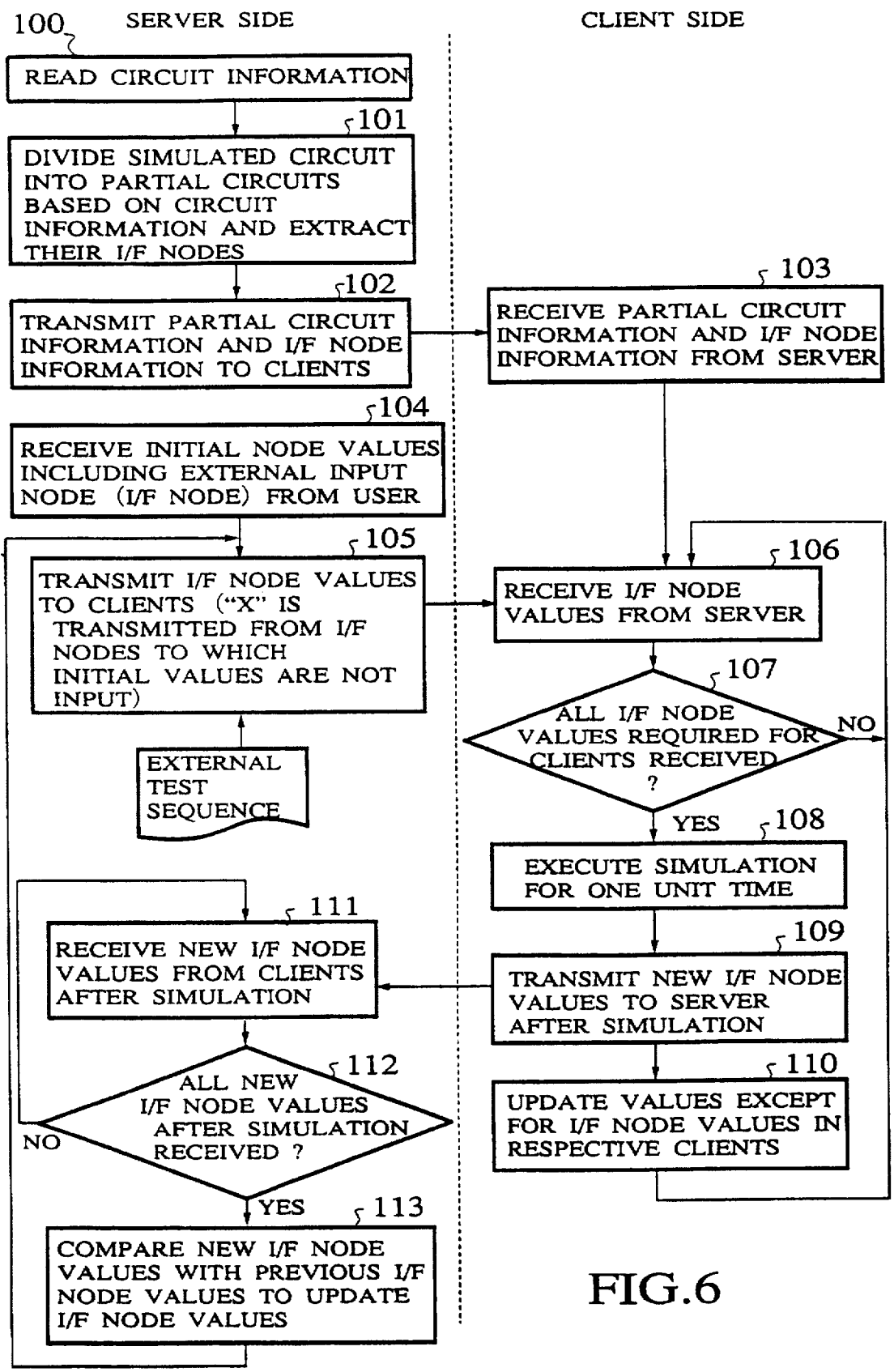
FIG. 6 is a flow chart showing procedures in a simulation process in the parallel simulator for a semiconductor integrated circuit shown in FIG. 5A.

FIG. 6 is a flow chart showing procedures in a simulation process in the parallel simulator for a semiconductor integrated circuit shown in FIG. 5A. FIG. 7 is a view showing the process of updating the I/F node values in the parallel simulator based on the procedures shown in FIG. 6 in cases in which the node values obtained after simulation for one unit time are changed and in which they are not changed.

In the aforementioned configuration, the node values obtained after simulation for one time unit are updated according to process flows shown in FIG. 6. In FIG. 6, first the server S1 reads circuit information of the simulated circuit which is described by circuit description language and shown in FIG. 1 (step 100). Then the server S1 divides the simulated circuit into the partial circuits B1, B2 based on the circuit information, and extracts the I/F nodes from every divided partial circuit (step 101). Subsequently, the server S1 examines the correspondence of extracted I/F nodes to the partial circuits, and then transmits respective partial circuit information and I/F node information relating to each partial circuit to corresponding clients C1, C2 (step 102). The clients C1, C2 receive information regrading their respective partial circuits and I/F node information from the server S1, and prepare for simulation to be effected (step 103). Next, the server S1 receives a test sequence as file input or command input from the external user at time 0. In other words, the user inputs initial values of the nodes, including external input nodes (I/F nodes), into the server S1 (step 104). The server S1 transmits only the I/F node values among input node values to respective clients C1, and C2 which they require for simulation. At that time, node values for which an initial value is not supplied, "x" is transmitted (step 105). Then the server S1 waits for the I/F node values which are obtained after simulation and transmitted from respective clients C1, C2.

On the client side, respective clients C1, C2 receive the I/F node values from the server S1 (step 106). Each of the clients C1, C2 continues its receiving process until all I/F node values required for the client are received. Then respective clients C1, C2 determine whether reception of all I/F node values is completed (step 107). After receiving all I/F node values, respective clients C1, C2 perform simulations for one time unit based on the received I/F node values (step 108). Thereafter, respective clients C1, C2 transmit the I/F node values obtained newly after through simulation to the server S1 (step 109). As exemplified in FIG. 7, if the node values are changed after simulation (for instance, the I/F node value is changed from "0" to "1" in the client 1), respective clients C1, C2 transmit the new I/F node values obtained after simulation to the server S1. However, as exemplified in FIG. 7, if the node values are changed in a client after execution of simulation for one time unit, the client transmits to the server S1 unchanged information (N) indicating that no change of the I/F node value occurred after simulation. Subsequently, respective clients C1, C2 update an internal node value or internal node values (excluding the I/F node values) independently therein (step 110). As a result, the internal node values are never transmitted from the clients C1, C2 to the server S1. Then respective clients C1, C2 wait for the next reception of I/F node values to prepare for the next simulation (step 106).

Returning to the sever side, the server S1 receives the I/F node values obtained after simulation for one time unit from respective clients C1, C2 (step 111). The server S1 continues to receive the I/F node values until the server S/1 receives all I/F node values from respective clients C1, C2. After receiving all I/F node values (step 112), the server S1 compares new I/F node values from respective clients C1, C2, and updates the I/F node values (step 113) if necessary. Thereafter, updated I/F node values and externally supplied I/F node values are transmitted from the server S1 to corresponding clients C1, C2 (step 105). Then, the next simulation will be executed. Such operations are conducted repeatedly to simulate the operation of the simulated circuit.

In such a simulation process, the I/F node values are updated and managed by the server S1 while the internal node values are updated and managed by respective clients C1, C2. As a result, the situation wherein the same node values must be managed by a plurality of work stations like the conventional parallel simulator can be eliminated. Thereby, the amount of information transmitted between the server S1 and the clients C1, C2 can be reduced, thus shortening a process time required for transmission. In addition, since the number of node values which are updated and managed by both the server S1 and the clients C1, C2 can be decreased, the memory capacity required for storing node values can be decreased. Moreover, the burden of update and management can be reduced on both the server S1 and the clients C1, C2, and update time can be shortened. As a result, simulation time can also be decreased.

Since the unchanged information (N) signal is transmitted when a node value is not changed in the update process, the need to update the node values while they are being compared with the node values obtained by simulation at the preceding time unit like the conventional parallel simulator is eliminated. Further, the same is true when the node values are changed. In other words, in the present invention, since, as shown in FIG. 7, the signal value "N" as well as conventional signal values "0", "1" and "x" is employed upon updating the I/F node values, the update of the I/F node values can be processed without the node values obtained by simulation at the preceding time unit regardless of change of the I/F node values. Accordingly, it is unnecessary to store the I/F node values obtained at the preceding time unit in the server S1.

In addition, by introducing the unchanged information signal (N) into the update process of the node values, the I/F node values which are utilized by a plurality of clients can be updated in the parallel simulator like combination patterns shown in FIG. 8. Symbols shown in FIG. 8 are identical to those shown in FIG. 4. In the case where the I/F node values are used by only a single client, the update process can be applied similarly by setting the number of clients in FIG. 8 to a single client.

In FIG. 8, the I/F node values (NS1B) which must be held in the server S1 in the conventional parallel simulator subsequent to simulation at the preceding time unit can be neglected. Under such condition, if the I/F node value (NC1) obtained after simulation in the client C1 at the preceding time unit and the I/F node value (NC2) obtained after simulation in the client C2 at the preceding time unit are different from each other, one of the I/F node values must be unchanged since it is not possible to have a circuit in which both I/F node values are changed simultaneously. Therefore, the I/F node value which does not remain unchanged can be adopted as a new update I/F node value.

In the above update process, with respect to the different I/F node values of NS1B, combination patterns shown in FIG. 8 can be summarized or simplified. For instance, with respect to the I/F node values (NS1B) of "N", "0", "1" and "x", combination patterns in which the I/F node value (NC1), the I/F node value (NC2) and the updated I/F node value (NS1A) obtained after simulation at the preceding time unit are set to "N" become identical patterns if the I/F node value (NS1B) may be disregarded, as described above. Therefore, such combination patterns can be simplified. In the present invention, since the I/F node values (NS1B) are not needed, the number of combination patterns can be significantly reduced in contrast to the conventional art.

Figures 9, 10:
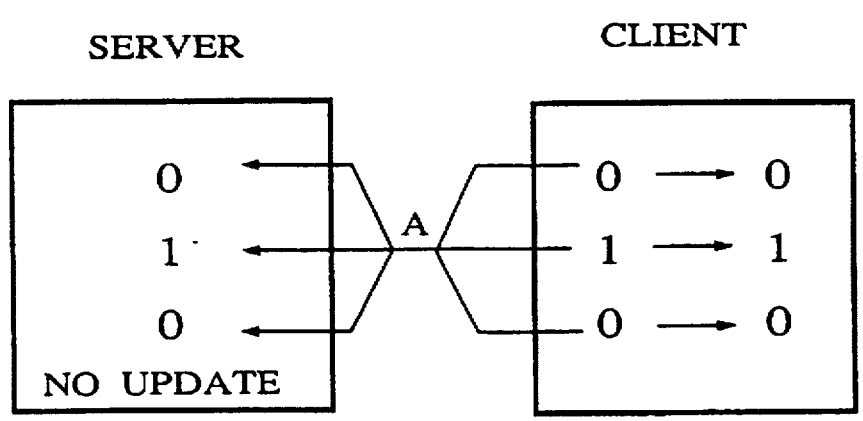
FIG. 9 is a view showing update combination patterns of the I/F node values obtained by putting together common combination patterns shown in FIG. 8.
FIG. 10 is a view showing transmission of information when the I/F node values are updated in a parallel simulator for a semiconductor integrated circuit according to a second embodiment of the present invention.

Hence, the combination patterns shown in FIG. 8 can be simplified as shown in FIG. 9 by summarizing the combination patterns in FIG. 8. Thus, in the update process, the number of combination patterns of the I/F node values of respective clients C1, C2 can be decreased in comparison with the conventional ones shown in FIG. 4. For this reason, the memory capacity required for storing this information can also be reduced significantly.

Assuming that the number of clients is set to m, in the prior art, the server can take three I/F node values, i.e., "0", "1", "x" in the previous update process. In addition, as to I/F node values taken by the clients after simulation, either all clients take the same values (i.e., three ways of values), or one or more clients take the same values as those taken by the server and remaining clients take mutually the same values which are different from those taken by the server (i.e., $2(m-1)$ values). As a result, when the I/F node values are updated, the number of combination patterns of information in the prior art is given as $3 \times \{3+2(m-1)\}=3(2m+1)$. On the other hand, in the above first embodiment, as to I/F node values taken by the clients after simulation, either all clients take the same values (i.e., four ways of 0,1, x, N values), or one or more clients take the same value N and remaining clients take mutually the same values (i.e., 0, 1, N) except for the value N (i.e., $3(m-1)$ values). As a result, the number of combination patterns of information in the present invention is given as $4+3(m-1)=3m+1$.

Figures 3, 4:
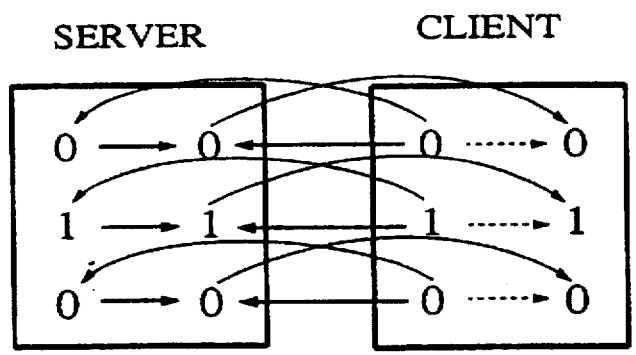
FIG. 3 is a view showing transmission of information when I/F node values are updated in the conventional parallel simulator for a semiconductor integrated circuit.
FIG. 4 is a view showing update combination patterns of the I/F node values in the conventional parallel simulator for the semiconductor integrated circuit in the case where a plurality of clients manage the same I/F node values.

In addition, assuming that the memory capacity required for storing the I/F node values is regarded as unit memory amount in FIGS. 4 and 9, in the prior art, the memory amount required for updating the I/F node values can be obtained as $3(2m+1)(m+2)$ by multiplying the number of clients m+2 by the number of patterns $3(2m+1)$. On the other hand, in the first embodiment, the memory amount can be obtained as $(3m+1)(m+1)$ by multiplying the new values of the server and the number of clients, i.e., m+1 by the number of patterns 3m+1. With the above, in the first embodiment, if the number of clients becomes large, the combination patterns of information and the memory capacity can be reduced substantially to one half of the prior art when the I/F node values are updated.

Second Embodiment

Next, a parallel simulator for a semiconductor integrated circuit according to a second embodiment of the present invention will be explained.

As a feature of the second embodiment, if all I/F node values relating to a certain client of a plurality of clients are the same before and after simulation for one time unit, only information indicating such effect is transmitted from the client to the server S1. In other words, in the prior art, as shown in FIG. 3, all I/F node values are transmitted from the client to the server after simulation. On the contrary, in the second embodiment, as shown in FIG. 10, if all I/F node values pertaining to a certain client remain the same, information (A) indicating such effect is set in the client and only then is the information (A) transmitted from the client to the server S1.

According to the second embodiment, if all I/F node values relating to a certain client are the same before and after simulation for one time unit the, amount of information to be transmitted can be reduced much more in contrast to the above first embodiment, so that simulation time can be decreased.

Third Embodiment

Next, a parallel simulator for a semiconductor integrated circuit according to a third embodiment of the present invention will be explained.

Figure 11A:
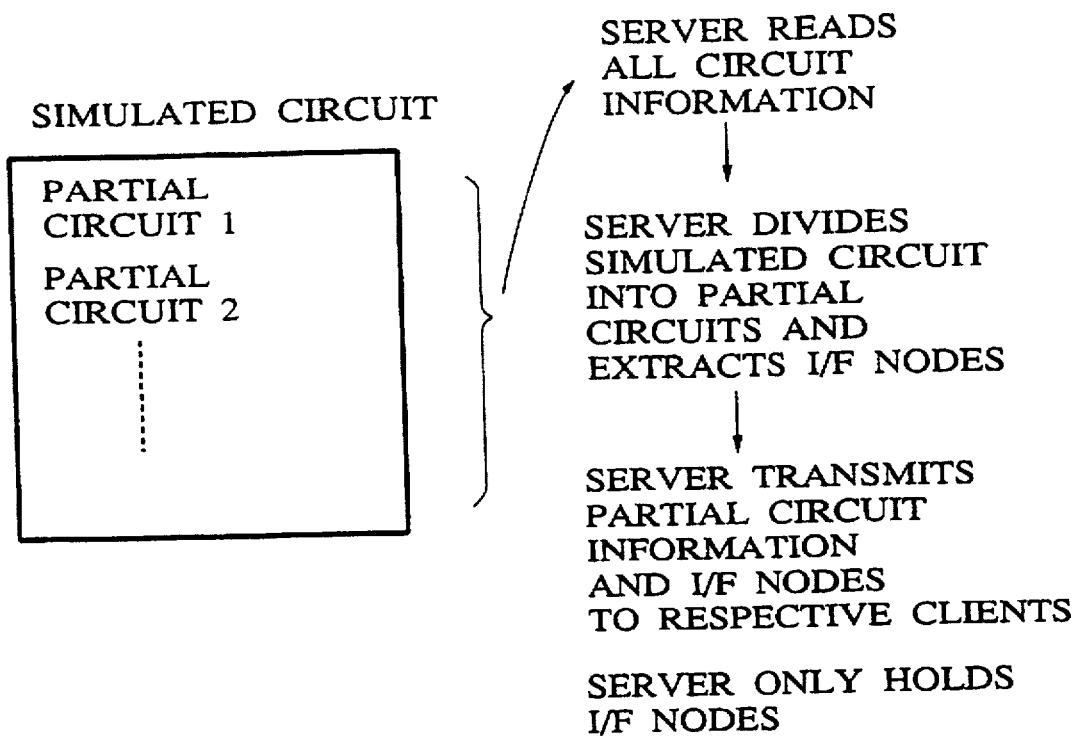
FIG. 11A is a view explaining the operation of a conventional parallel simulator for a semiconductor integrated circuit.
Figure 11B:
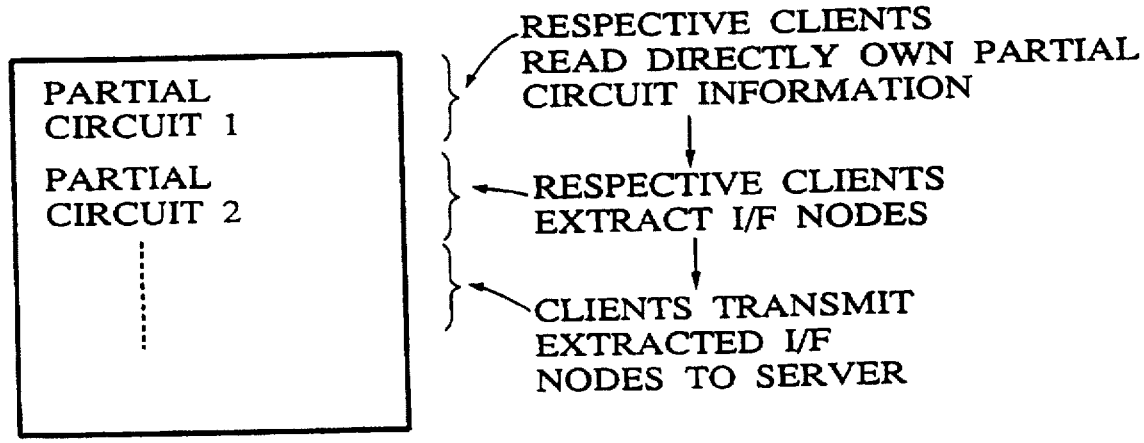
FIG. 11B is a view explaining the operation of a parallel simulator for a semiconductor integrated circuit according to a third embodiment of the present invention.

As shown in FIG. 11A, in the first and second embodiments, the server S1 reads all circuit information of the simulated circuit written in circuit description language. Then the server S1 divides the simulated circuit into partial circuits B1, B2, extracts the I/F nodes, and examines correspondences between extracted I/F nodes and partial circuits B1, B2. Then the server S1 sets initial values of the node values to the I/F nodes. Then the server S1 transmits information as to partial circuits and the I/F nodes to respective clients, and holds only the I/F nodes therein. On the other hand, in the third embodiment, the parallel simulator is so constituted, as shown in FIG. 11B, that respective clients C1, C2 conduct a series of operations described above, and then transmit resultant information to the server S1. In other words, the server does not distribute partial circuit information to respective clients after reading circuit information, but respective clients C1, C2 directly read information of their respective partial circuits. Then respective clients C1, C2 extract the I/F nodes and transmit extracted the I/F nodes to the server S1.

According to the third embodiment, when the simulation is prepared, the load of the server can be reduced and a preparing time for starting the simulation can be shortened in comparison with the above first and second embodiments.

Note that the present invention is not limited to the above respective embodiments, and a combination of the first embodiment and the second embodiment and a combination of the second embodiment and the third embodiment may be utilized. In such cases, advantages attained by respective embodiments can be obtained together.

As has been described above, according to the present invention, the server updates and manages the I/F node values collectively, whereas respective clients update and manage the corresponding internal node values respectively. Therefore, when the I/F node values are updated, the amount of information to be transmitted can be reduced and simulation time can be shortened.

In addition, according to the present invention, where the I/F node value is the same before and after simulation, the I/F node value is updated by transmitting information indicating such effect. Therefore, when the I/F node value is updated, an amount of information to be transmitted can be reduced, simulation time can be decreased, and a memory amount for storing information necessary for simulation can be decreased.

Moreover, according to the present invention, where all I/F node values pertaining to a certain client are the same before and after simulation, the I/F node values are updated by transmitting information indicating such effect. Therefore, when the I/F node values are updated, the amount of information to be transmitted can be reduced, simulation time can be decreased much more, and a memory amount for storing information necessary for simulation can be decreased much more.

What is claimed is:

1. A system for simulating a semiconductor integrated circuit using a network of work stations, comprising:

a plurality of simulation sections, each simulation section comprising a work station corresponding to one of a plurality of partial circuits of a circuit to be simulated for executing parallel simulation of a corresponding partial circuit at successive time units internal node values which are completed in said corresponding to determine values at nodes internal to said partial circuit; and a node managing section comprising a work station for synchronizing said parallel simulations and for managing values of interface (I/F) nodes of said partial circuits, transmitting I/F node volues ot said simulation sections for simulation of said partial circuits at said successive time units, and updating I/F node values provided by said simulation sections as results of partial simulations;

each of said plurality of simulation sections being further for providing a value of an I/F node of its corresponding partial circuit to said node managing section if said value has changed as a result of simulation of said corresponding partial circuit.

2. The system according to claim 1, wherein said node managing section reads circuit information representing said simulated circuit in a circuit description language, divides the simulated circuit into partial circuits based on said circuit information, determines I/F nodes partial circuits, examines correspondences between extracted of said partial circuits, and notifies each simulation section of its corresponding I/F nodes.

3. The system according to claim 2, wherein said node managing section updates and manages said I/F node values by transmitting and receiving signals representing values of an I/F node in the form of one of a high level (1), low level (0), don't care (x) or unchanged information (N) signal.

4. The system according to claim 2, wherein said simulation sections transmits an unchanged information (N) signal to said node managing section if all I/F node values pertaining to said simulation section are the same before and after simulation.

5. The system according to claim 1, wherein said node managing section updates and manages said I/F node values by transmitting and receiving signals representing values of an I/F node in the form of one of a high level (1), low level (0), don't care (x) or unchanged information (N) signal.

6. The system according to claim 5, wherein said simulation sections transmit an unchanged information (N) signal to said node managing section if all I/F node values pertaining to said simulation section are the same before and after simulation.

7. The system according to claim 5, wherein each of said simulation sections reads circuit information describing its corresponding partial circuit from circuit information describing said simulated circuit in a circuit description language, determines the I/F nodes of its corresponding partial circuit, and informs the node managing section of the I/F nodes of its corresponding circuit.

8. The system according to claim 1, wherein said simulation sections transmit an unchanged information (N) signal to said node managing section if all I/F node values pertaining to said simulation section are the same before and after simulation.

9. The system according to claim 8, wherein each of said simulation sections reads circuit information describing its corresponding partial circuit from circuit information describing said simulated circuit in a circuit description language, determines the I/F nodes of its corresponding partial circuit and informs the node managing section of the I/F nodes of its corresponding circuit.

10. The system according to claim 1, wherein each of said simulation sections reads circuit information describing its corresponding partial circuit from circuit information describing said simulated circuit in a circuit description language, determines the I/F nodes of its corresponding partial circuit, and informs the node managing section of the I/F nodes of its corresponding circuit.

* * * * *